(12) United States Patent
Muller et al.

(10) Patent No.: US 9,710,586 B2
(45) Date of Patent: Jul. 18, 2017

(54) AUTOMATED STATE MACHINE EXTRACTION FOR RAPID-SINGLE FLUX-QUANTUM CIRCUITS

(71) Applicant: Stellenbosch University, Stellenbosch (ZA)

(72) Inventors: Louis Crouse Muller, Paarl (ZA); Coenrad Johann Fourie, Durbanville (ZA)

(73) Assignee: Stellenbosch University, Stellenbosch, Western Cape Province (ZA)

( * ) Notice: Subject to any disclaimer, the term of this patent is extended or adjusted under 35 U.S.C. 154(b) by 225 days.

(21) Appl. No.: 14/412,344

(22) PCT Filed: Jul. 2, 2013

(86) PCT No.: PCT/IB2013/055427
§ 371 (c)(1),
(2) Date: Dec. 31, 2014

(87) PCT Pub. No.: WO2014/006567
PCT Pub. Date: Jan. 9, 2014

(65) Prior Publication Data
US 2015/0178432 A1 Jun. 25, 2015

(30) Foreign Application Priority Data

Jul. 2, 2012 (ZA) .................................. 2012/04910

(51) Int. Cl.
*G06F 17/50* (2006.01)
*H03K 19/195* (2006.01)

(52) U.S. Cl.
CPC ...... *G06F 17/5059* (2013.01); *G06F 17/5022* (2013.01); *G06F 17/5045* (2013.01); *H03K 19/1954* (2013.01)

(58) Field of Classification Search
CPC ............. G06F 17/5059; G06F 17/5022; G06F 17/5045; G06F 19/1954
(Continued)

(56) References Cited

U.S. PATENT DOCUMENTS 6,182,268 B1   1/2001   McElvain
7,608,356 B2 * 10/2009   Risen et al. .................. 429/492
(Continued)

OTHER PUBLICATIONS

Polonsky s ED—Institute of Electrical and Electronics Engineers: 11RSFQ: What we know and what we donIt 11, Proceedings of the International Conference on Computer Design. ICCD. VLSI in Computers and Processors. Austin, Oct. 7-9, 1996; [Proceedings of the International Conference on Computer Design. ICCD. VLSI in Computers and Processors], Los Alamitos,, Oct. 7, 1996 ( Oct. 7, 1996) ' pp. 406-412.
(Continued)

*Primary Examiner* — Suchin Parihar
(74) *Attorney, Agent, or Firm* — Womble Carlyle Sandridge & Rice LLP

(57) ABSTRACT

The invention provides a method and system for extracting a state machine representation of a digital logic superconductive circuit from an alphanumeric representation of the circuit. The alphanumeric representation typically specifies circuit components including inductive elements, their interconnectivity and input and output nodes. The method according to the invention comprising the steps of simulating the circuit in a suitable software environment utilizing the alphanumeric representation; identifying inductive loops in the circuit; identifying inductive loops in the circuit capable of storing one or more magnetic fluxons and discarding all others; and extracting the state machine representation, using only the inductive loops in the circuit capable of storing magnetic fluxons.

12 Claims, 7 Drawing Sheets

(58) Field of Classification Search
USPC .......................................................... 716/30
See application file for complete search history.

(56) References Cited

U.S. PATENT DOCUMENTS

2005/0078022 A1* 4/2005 Hirano et al. ................ 341/143
2005/0181252 A1* 8/2005 Risen et al. .................... 429/30
2015/0263736 A1* 9/2015 Herr et al. .................... 429/492

OTHER PUBLICATIONS

Polonsky S V et al: "Single flux, quantum B flip-flop and its possible applications", IEEE Transactions on Applied Superconductivity, IEEE Service Center, Los Alamitos, CA, US, vol. 4, No. 1, Mar. 1, 1994 (Mar. 1, 1994), pp. 9-18.
Krasniewski A: "Logic simulation of RSFQ circuits", IEEE Transactions on Applied Superconductivity, IEEE Service Center, Los Alamitos, CA, US, vol. 3, No. 1, Mar. 1, 1993 (Mar. 1, 1993), pp. 33-38.

* cited by examiner

Circulating Current When Storing Fluxon

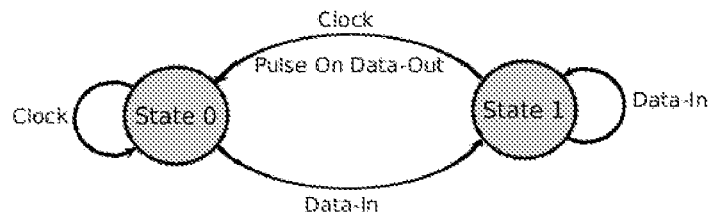

Figure 9

```
                                                        ___7
    LIBRARY ieee;                                      /
    USE ieee.std_logic_1164.all;

90 ── ENTITY rsfq_dff IS
          PORT (data_in, clock : IN STD_LOGIC;  ────── 91
                data_out : OUT STD_LOGIC);      ────── 92
      END rsfq_dff;

ARCHITECTURE arch_rsfq_dff OF rsfq_dff IS
          TYPE states IS (state_0, state_1);
          SIGNAL current_state : states := state_0;   ────── 93
          SIGNAL data_out_sig : STD_LOGIC := '0';     ────── 94
          SIGNAL data_in_err : BIT := '0';
          SIGNAL clock_err : BIT := '0';
      BEGIN
          data_out <= data_out_sig;
95 ──     PROCESS(data_in, clock)
          BEGIN
              IF (data_in'EVENT AND data_in = '1') THEN  ────── 96
                  IF (data_in_err = '1') THEN            ────── 97
                      REPORT "Data-In_Timing_Violation" SEVERITY FAILURE;
                  ELSIF (data_in_err = '0') THEN
                      CASE current_state IS
                          WHEN state_0 =>
                              current_state <= state_1;
                              clock_err <= '1','0' AFTER 10 PS;
                          WHEN state_1 =>
                              current_state <= state_1;
                      END CASE;
                  END IF;
              ELSIF (clock'EVENT AND clock = '1') THEN
                  IF (clock_err = '1') THEN
                      REPORT "Clock_Timing_Violation" SEVERITY FAILURE;
                  ELSIF (clock_err = '0') THEN
                      CASE current_state IS
                          WHEN state_0 =>
                              current_state <= state_0;
                          WHEN state_1 =>
                              current_state <= state_0;
                              data_in_err <= '1','0' AFTER 10 PS;
                              data_out <= '1' AFTER 5 PS, '0' AFTER 6 PS;
                      END CASE;
                  END IF;
              END IF;
          END PROCESS;
      END arch_rsfq_dff;
```

Figure 10

AUTOMATED STATE MACHINE EXTRACTION FOR RAPID-SINGLE FLUX-QUANTUM CIRCUITS

CROSS-REFERENCE TO RELATED APPLICATIONS

This application is a national stage filing under 35 U.S.C. 371 of PCT/IB2013/055427 filed Jul. 2, 2013, which International Application was published by the International Bureau in English on Jan. 9, 2014, which is hereby incorporated herein in its entirety by reference.

FIELD OF THE INVENTION

This invention relates to Rapid-Single Flux-Quantum (RSFQ) logic devices. In particular, the invention relates to an automated method of extracting a state machine representation of an RSFQ circuit.

BACKGROUND TO THE INVENTION

When the temperature of superconductor materials are reduced below a certain value (known as the critical temperature) the resistance of the material sharply approaches zero. The discovery of this phenomenon led to the development of a number of different technologies. One of these technologies is in the digital logic field. Currently the majority of digital logic circuits are designed using transistor technology, but the superconductive phenomenon led to the development of another option for logic circuit design. These new devices constitute a family called Single-Flux-Quantum (SFQ) circuits, of which Rapid-Single Flux-Quantum (RSFQ) digital logic devices are the most popular.

In normal transistor logic, voltage states are used to indicate a logical (binary) 1 or 0. Also, the state of the circuit can be altered by saving these voltage levels inside devices such as "Flip-Flops" and "Latches". RSFQ circuits, on the other hand, use short voltage pulses which each correspond to a Single-Flux-Quantum (SFQ) of magnetic flux. An SFQ is the fundamental unit of magnetic flux meaning that all other flux amounts are integer multiples of this value. This amount of flux is also commonly referred to as a fluxon. The indication for a logical (binary) 1 or 0 in RSFQ circuits are thus the presence or absence of these small voltage pulses. These voltage pulses can also be saved in inductive loops in order to change the state of a RSFQ digital logic circuit.

The active elements of RSFQ digital logic circuits are Josephson Junctions. In RSFQ circuits these Junctions are normally over-damped by adding a resistor in parallel to the Junction. In this specification these resistors are omitted for the sake of clarity. Josephson Junctions normally operate in a superconductive state, thus implying that they have essentially no resistance. If, however, the amount of current through these devices reach a certain level (the critical current) the Junction returns to a resistive state. As a result of this switching from superconductive to resistive state, an SFQ voltage pulse is propagated. An SFQ pulse is able to momentarily push a Junction into its resistive state, which in turn causes a voltage to form due to the current through the Junction (V=IR). Due to the over-damped nature of the Junction this voltage will again be an SFQ pulse that is propagated further along the circuit whilst the Junction returns to its superconductive state. Another parameter of the junction, the Junction phase, is closely related to the voltage over the Junction and will be used to measure if a pulse was propagated by the Junction. This propagation mechanism is often referred to as switching.

In RSFQ digital logic devices, binary representations are implemented by the presence or absence of a single magnetic fluxon. These fluxons are shuttled throughout the circuit in the form of picosecond long voltage pulses which are passed and amplified by the active elements of RSFQ circuits. These elements are over-damped Josephson Junctions. If a Junction, usually operating in its superconductive state, is biased at around 80% of its critical current value, the voltage pulse can increase the total current amount enough to cause the Junction to enter its resistive state. Due to the over-damped nature of the Junction, a $2\pi$ phase shift of the Junction is induced after which the Junction returns to its superconductive state. This $2\pi$ phase shift is associated with the passing of magnetic flux through the junction corresponding to a single flux quantum. A fluxon shuttle can thus be formed by connecting over-damped Josephson Junctions with superconductors.

As shown in FIG. 1, a current source is used to bias both Josephson Junctions to around 80% of their critical current values. The inductances represent the inductance of the connecting superconductors. A pulse entering on the input would be reproduced at the output after both Junctions switched in turn.

If the inductance of the connecting superconductor is large enough, a fluxon may be trapped inside a superconducting loop. An inductive loop can only store an integer multiple of fluxons. The value of this storage inductor is dependent on four other variables. These variables are the size of the two Junctions forming the loop as well as the bias current applied to each of the Junctions.

An example of this behaviour can be seen in the D-Flip-Flop circuit shown in FIG. 2. A pulse entering on the "Input" will cause junction B2 to switch causing the pulse to be shuttled along the circuit. The inductance of the loop B2→L2→B3 is, however, large enough to store an SFQ pulse, thus inhibiting Junction B3's ability to switch and pass the pulse on further. This stored fluxon causes an increase in current in Junction B3 due to the circulating current induced by the trapped fluxon. An SFQ pulse entering on the "Clock" input will increase the current in Junction B3 further causing it to switch to its resistive state and to pass an SFQ pulse on to the "Output" port. Junction B4 is used to guard against unwanted behaviour when no fluxon is stored inside the storage loop. Junction B4 is biased to coincide with the current direction of an entering pulse on "Clock". If no fluxon is stored in the storage loop an SFQ pulse entering on "Clock" will cause Junction B4 to enter its resistive state before Junction B3, thus causing the SFQ pulse to escape the circuit. A stored fluxon causes a decrease in the bias current of Junction B4, allowing Junction B3 to switch before Junction B4 can reach its resistive state. In the same way Junction B1 is used to "throw out" any input pulses when a fluxon is already being stored. It is important to note that the only way to change the state of an RSFQ digital logic circuit is the storage of SFQ pulses.

The way in which flux change is calculated can be explained with reference to FIG. 3. It is assumed that the inductance of the storage loop B2→L2→B3 is large enough to store an SFQ pulse. The amount of flux currently in the loop can then be calculated by multiplying the amount of current through each component with the value of the component's inductance, using the following formula:

$$\Phi = IL$$

The inductance of a Josephson Junction changes with the instantaneous current through the Junction. This inductance can be approximated by:

$$L = L_1 \frac{\arcsin 2\pi \frac{i}{I_c}}{\frac{i}{I_c}}$$

Where i is the instantaneous current and $I_c$ is the Junction's critical current. Also:

$$L_1 \frac{\Phi_0}{2\pi I_c}$$

where $\Phi_0 = 2.0679e^{-15}$Wb.

Using this method a change in flux due to an input pulse can be identified by calculating the sum of flux changes of each component in the loop. Note also that the total amount of flux change in the loop B2→L2→L3→B4 also has to equal that of a fluxon. This is because the amount of current change in the branch of B3 has to equal the amount of current in the branch L3→B4 due to a screening current being formed that attempts to mitigate the net increase of flux in the loop B3→L3→B4. If the amount of current was not equal this would mean that some flux was being stored in the loop B3→L3→B4 which, due to the quantization of flux in superconductive circuits, is not possible.

An exception to the above situation can be seen in FIG. 4. Suppose that the inductance of the loop B2→L2→L4→B3 is not enough to store an SFQ pulse but that the inductance of the loop B2→L2→L3 is sufficient. Under normal circumstances a stored fluxon in B2→L2→L3 will have the effect that a screening current is formed in L4→B3 to try and mitigate the increase in flux in the loop L3→L4→B3. Ideally the change in flux in the branch L4→B3 should be equal to the change in flux of the branch L3 so that the net increase in flux is zero. If, however, the amount of current necessary to screen the change in net flux would cause B3 to switch, the excess current is shunted through the branch L5→B4. This has the appearance of a non-zero change in flux in the loop B3→L5→B4. This does not pose a problem however, since the measurement of any flux which is not an integer multiple of a SFQ clearly point to the storage of a flux nearby. This fluxon storage loop can thus be identified by exploring adjacent loops.

The design of RSFQ circuits is still in its infancy and very little help is available for the designer to create large, robust circuits. The method described in this document aims to allow the designer to focus on the logical aspects of his design (for example AND gates, OR gates etc.) without spending time on the electrical circuit design (Josephson Junctions, inductors, resistors).

SUMMARY OF THE INVENTION

In accordance with this invention there is provided an automated method of extracting a state machine representation of a digital logic superconductive circuit from an alphanumeric representation of the circuit, the alphanumeric representation specifying circuit components including at least inductive elements, their interconnectivity and input and output nodes, the method comprising the steps of simulating the circuit in a suitable software environment utilising the alphanumeric representation;

identifying all inductive loops in the circuit;

identifying inductive loops in the circuit capable of storing one or more magnetic fluxons and discarding all others; and extracting the state machine representation, using only the inductive loops in the circuit capable of storing magnetic fluxons, by:

defining an initial state for the circuit and analysing the circuit in the initial state;

iteratively applying a combination of input signals to the input nodes of the circuit and analysing the circuit for each input signal so applied with reference to the initial state to determine if the circuit enters a new state when the input signals are applied; and iteratively applying input signals to each of the input nodes of the circuit with the circuit in each newly identified state, each time analysing the circuit to identify additional new states, until all possible states of the circuit have been identified.

Further features of the invention provide for the method to include the steps of specifying a set of input rules comprising unallowable combinations of input signals and avoiding the unallowable combinations during the step of extracting the state machine; parsing and flattening the alphanumeric representation of the circuit; storing the inductive loops capable of storing magnetic fluxons in a vector of components for further processing; and measuring and storing timing delays between the application of input signals to input nodes and resulting changes on output nodes of the circuit.

The invention also provides an automated method of constructing a Hardware Description Language ("HDL") model for a digital logic superconductive circuit from an alphanumeric representation of the circuit, the alphanumeric representation specifying circuit components including at least inductive elements, their interconnectivity and input and output nodes, the method comprising the steps of extracting a state machine representation for the circuit in accordance with the method described above;

extracting timing characteristics of the circuit by iteratively applying different combinations of input signals to the circuit in each of its extracted states and measuring the performance of the circuit; and constructing the HDL model using the state machine representation and extracted timing characteristics of the circuit.

Further features of the invention provide for the step of extracting the timing characteristics of the circuit to include the steps of measuring the smallest possible delay between two consecutive input signals with which, when applied, the circuit is still functional, the smallest possible delay being measured with the circuit in each of the identified states and for all possible input combinations of the circuit; testing the functionality of the circuit for a chosen combination of input signals and delays between the signals by determining whether the circuit transitioned into the correct state on application of the input signals, as determined by the state machine representation of the circuit; and if the circuit is affected by a chosen delay between input signals, utilising a binary search routine to determine the time delay between input signals at which the circuit stops functioning correctly.

A still further feature of the invention provides for using the state machine representation of the circuit for failure testing methodologies such as yield calculation.

The invention also extends to a system for extracting a state machine representation of a digital logic superconductive circuit from an alphanumeric representation of the circuit, the alphanumeric representation specifying circuit components, including at least inductive elements, their interconnectivity and input and output nodes, the system comprising:

an input configured to receive the alphanumeric representation of the circuit;
a processor; and
an electronic storage module on which is stored instructions configured to cause the processor to simulate the circuit in a suitable software environment utilising the alphanumeric representation, identify inductive loops in the circuit; identify inductive loops in the circuit capable of storing one or more magnetic fluxons and discard all others, and extract the state machine representation using only the inductive loops in the circuit capable of storing magnetic fluxons.

Further features of the invention provide for the machine instructions to further cause the processor to define an initial state for the circuit and analysing the circuit in the initial state; to iteratively apply a combination of input signals to the input nodes of the circuit and analyse the circuit for each input signal so applied with reference to the initial state to determine if the circuit enters a new state when the input signals are applied; and to iteratively apply input signals to each of the input nodes of the circuit with the circuit in each newly identified state, each time analysing the circuit to identify additional new states, until all possible states of the circuit have been identified.

BRIEF DESCRIPTION OF THE DRAWINGS

The invention will now be described, by way of example only with reference to the accompanying representations in which:

FIG. 9 is an example of a D-Flip-Flop state diagram;
and
FIG. 10 is an example of VHDL code generated by an extracted state machine.

DETAILED DESCRIPTION WITH REFERENCE TO THE DRAWINGS

Figure 5:
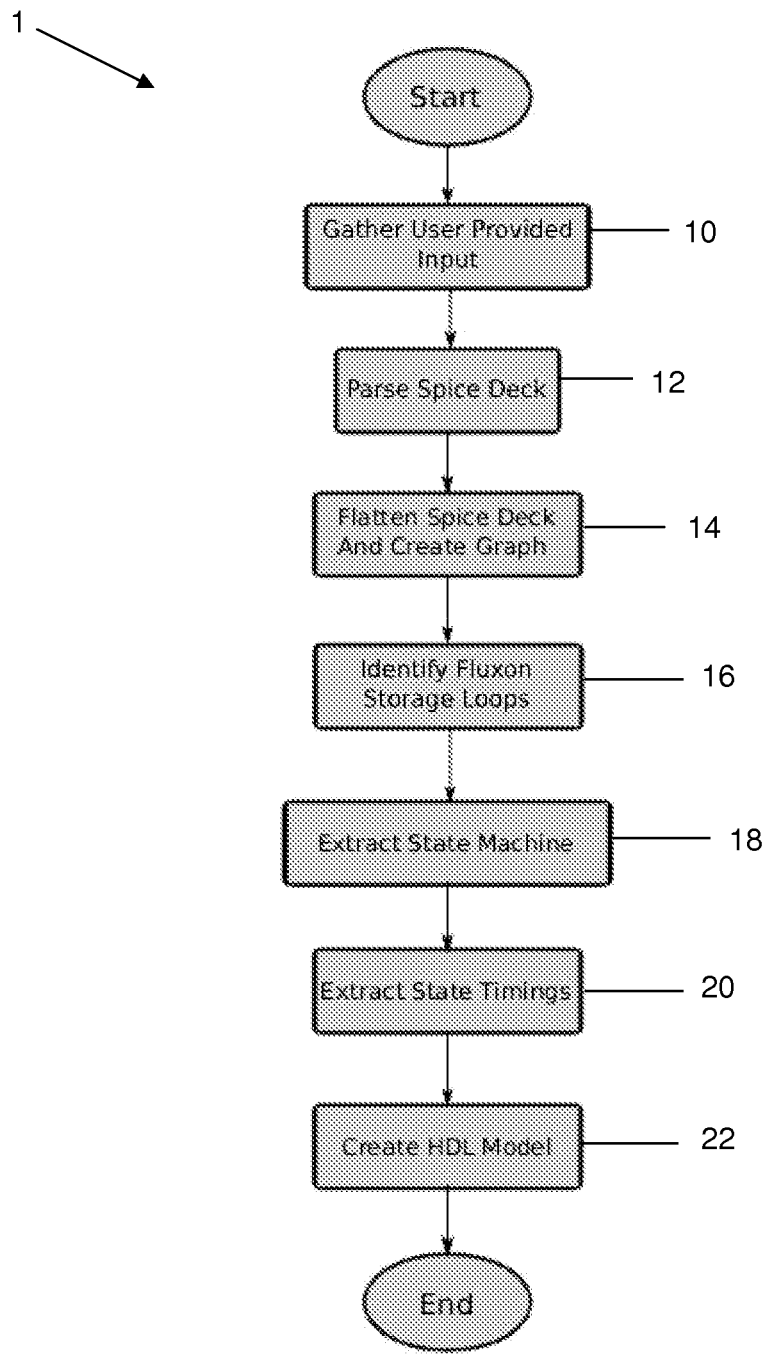
FIG. 5 is a flow diagram showing the main program flow of a method according to the invention.

The flow diagram (1) illustrated in FIG. 5 shows the steps followed in a method according to the invention. The steps include: gathering user provided input (10), parsing the Spice deck (12), flattening the Spice deck and creating a graph (14), identifying fluxon storage loops (16), extracting a state machine (18), extracting state timings (20) and creating a Hardware Description Language (HDL) model (22).

At the outset of the method, user input that is required is gathered (10). The input includes:

an alphanumeric representation of the circuit that specifies circuit components, including at least inductive elements, as well as their interconnectivity such as, for example, a Spice deck containing the circuit representation in a format parsable by JSIM or Jspice;
the input nodes of the circuit as represented in the Spice deck;
the output nodes of the circuit as represented in the Spice deck;
the maximum time after any input is applied needed for the circuit to stabilize; and
any user created rules.

It should be appreciated that the last two aspects may be optional.

A well designed digital logic circuit should be both stable and functional for any combination of pulses on its inputs. There are, however, times when a designer may decide that certain pulse combinations will never occur in practice. Since the algorithm will, unless otherwise instructed, assume that the circuit will be well behaved, any illegal input pulse combination should be added as input for the program. As an example, consider the D-Flip-Flop of FIG. 2. If Junction B1 is absent, two consecutive pulses on "Input" without a pulse on "Clock" will cause the circuit to incorrectly generate an output pulse. Thus in this example the program needs the limitation that only one pulse on "Input" is allowed and that this condition is reset by a pulse on the "Clock" input.

Parsing (12) and flattening the Spice deck (14) are the next steps. A Spice Deck in a format parsable by JSIM or JSPICE serves as input for the program. After parsing the Spice Deck a flattening procedure is run to instantiate a unique component for each sub-circuit instance found.

Completing this procedure will ensure that fluxon storage loops spanning multiple sub-circuits will be correctly identified. This procedure involves iterating through each component of every instantiated sub-circuit whilst assigning node numbers unique to the spice deck. The end result of the procedure is a spice deck that contains no sub-circuit definitions or sub-circuit instances. A unidirectional graph is also created of the spice deck to facilitate the searching of fluxon loops. The nodes of the graph correspond to the unique nodes generated for the flattened Spice Deck whilst the edges of the graph correspond to the components themselves. The graph is updated as each component is discovered through the parsing and flattening process.

After the Spice Deck has been parsed and flattened, all the inductive loops in the circuit capable of storing one or more magnetic fluxons are identified at step (16). Before the inductive loops are extracted, all the components connected to nodes with only one connected component are removed from the graph. These nodes cannot form part of a loop and should thus not be investigated. Nodes serving as inputs and outputs for the circuit will thus be removed from the graph. The strategy of the algorithm finding an inductive loop is to find the shortest path from each inductor's first nodes, through the graph structure, to the second node of the inductor. Note that currently all the components used in RSFQ are two node devices.

Figure 6:
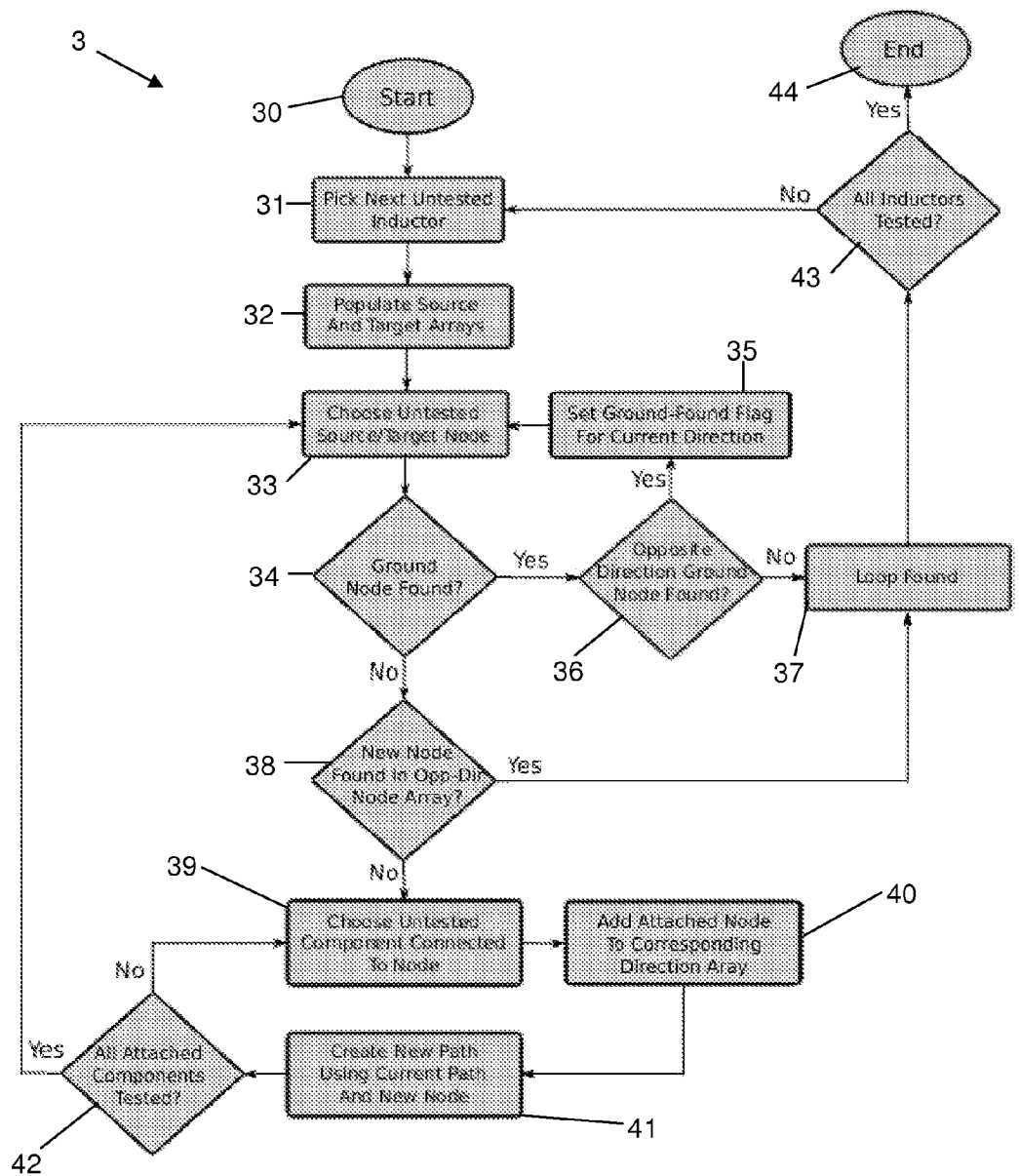
FIG. 6 is a flow diagram illustrating the method implemented to identify inductive loops.

The algorithm used to identify inductive loops will be explained in conjunction with FIG. 6. FIG. 6 shows a flow diagram (3) of the method used to identify inductive loops. It should be noted that the two nodes of the inductor under investigation shall be referred to as the target node and the source node, even though the component itself is not directional.

As previously stated, an inductive loop should be identified for each inductor in the circuit in order to ensure that all the possible loops are found. The algorithm thus starts off (30) by selecting an inductor for which an inductive loop has not yet been identified (31). Two different paths are created, each starting from one of the two nodes connected to the selected inductor (source node and the target node). These two paths will be separately expanded in the algorithm by adding adjacent nodes in order to find a common node. A common node would indicate a loop since there will be a path from the target node of the inductor to this common node as well as a path from the source node to the common node. It is thus necessary to store which nodes have been found on paths generated from the target node and source node separately (32). An array is also used to store the nodes that are yet to be investigated. Both of the target and source nodes will form part of this array initially. Once all the components connected to a node are tested the node is removed from this array.

The algorithm starts by selecting an untested node (33). This node might be on the path started from the target node or the source node of the inductor under investigation. Firstly the node is tested for being a ground (34) node. Ground nodes are treated differently than any other node in the circuit due to the amount of components that would generally be connected to ground. It is thus not cost effective to investigate all the components connected to the ground node and thus a flag is rather set (35) to remember that a ground node was found from the source or target path in a current direction. Furthermore, if a ground node flag is already set for the other direction (36) (target direction if a node on the source path is investigated and vice versa), it can immediately be surmised that a loop has been found (37). This indicates that there exists a path from the source node of the inductor to ground and also from the target node of the inductor to ground. These two paths combined will thus constitute a loop containing the inductor under test.

In the case that the node under test is not a ground node the already found nodes of the opposite direction are investigated for containing the node under test (38). If this is the case, a loop has once again been found (37) due to the fact that a path exists from the target node and source node to this common node. If no loop has been found the algorithm iterates through all the components connected to the node under test (39). Since all the components in the circuit are connected to two nodes, each component will thus add a new node to the untested node list (40). The path from the initial source or target node of the inductor under test will thus have branched into new paths (41). Once all the components have been investigated (42) a next untested node can be used (33) to repeat the process.

It should be noted that due to the fact that any node containing only one component has been removed from the graph, every inductor will necessarily form part of a loop. The implementation of the algorithm also ensures that the untested nodes are tested in an alternating fashion for paths originating from the source node and target node of the inductor under test. One node is added to the source path then a node is added to the target path, etc. This ensures that the smallest loop will be found for each inductor. It should also be noted that more than one inductor might be present in each loop, which might cause duplicate loops to be found. These duplicate loops are identified and removed. Note also that the inductive loop extraction algorithm might be slightly improved by thus noting which inductors were present in the previously found loop and removing all the inductors present in the loop from the inductor untested list used by the algorithm. The number of inductors that need to be investigated can thus be reduced. Once all inductors have been investigated (43) the algorithm ends (44).

Figure 7:
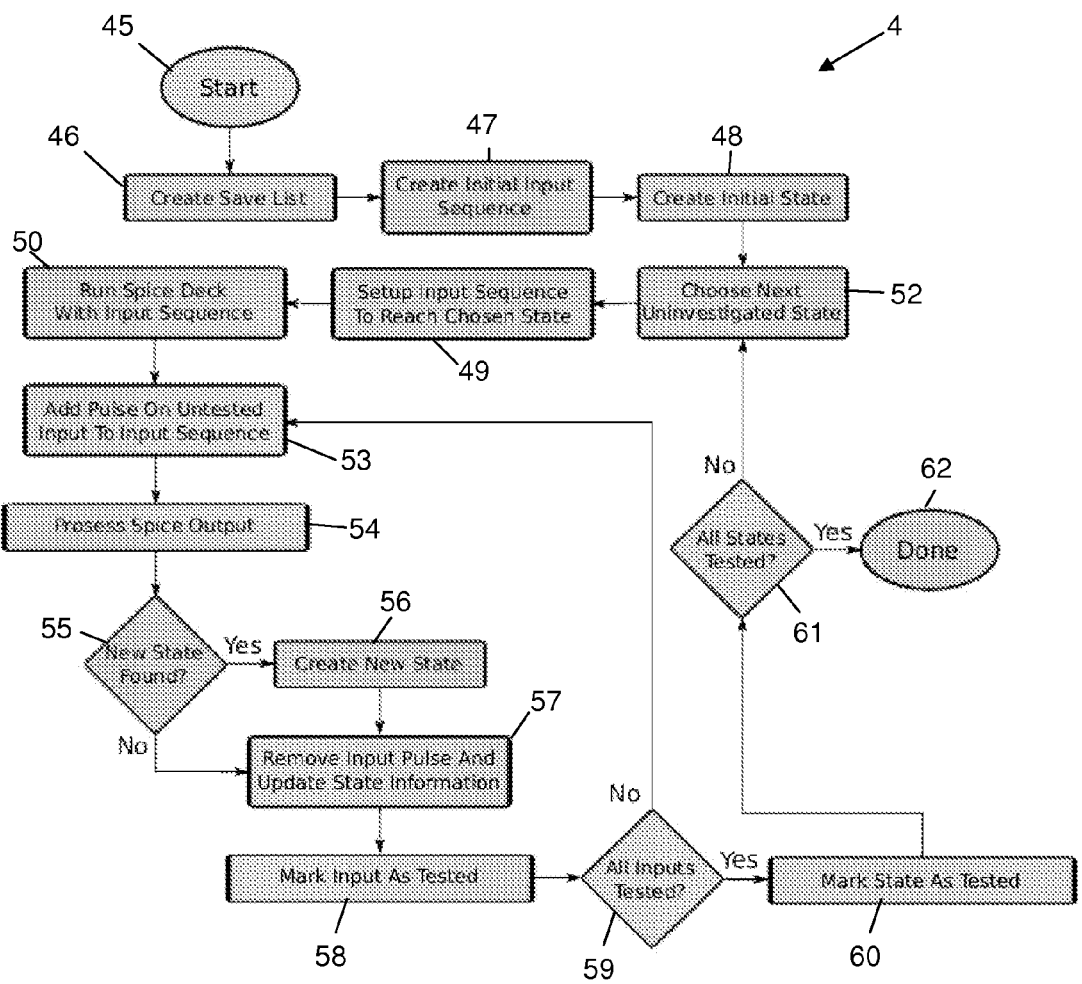
FIG. 7 is a flow diagram illustrating the method implemented to extract a state machine.

The next step in the method is the handling of the extraction of a state machine (18). Once all the inductive loops have been found in the circuit, the initial state machine extraction may commence. Note that for the first extraction of the spice diagram all the loops are investigated for possible fluxon storage. After the initial diagram has been extracted the loops to investigate are known thus increasing the execution speed of the state machine extraction for the use of timing and yield investigation. FIG. 7 illustrates a flow diagram (4) of the steps implemented as part of the method step to extract a state machine.

The first action after start (45) of the state diagram extraction algorithm is to create a list of all the components to investigate (46) and stored them in a so-called "Save List". The current through all the components that form part of one of the inductive loops as well as the phases of the junctions that the user specified as output junctions are added to this list. An initial input sequence is then created (47) and an associated initial state (48). Every state has an associated input sequence which holds the sequence of input pulses that caused the circuit to reach that state. This could, for example, be a pulse on Input A, followed by a pulse on Input C, followed by another pulse on Input C, etc. The time between the pulses should be chosen to ensure that no dynamic effects of the previously received pulse are still present in the circuit. This time can either be supplied by the user or roughly calculated from the longest possible path from the input node to the output node.

Figure 3:
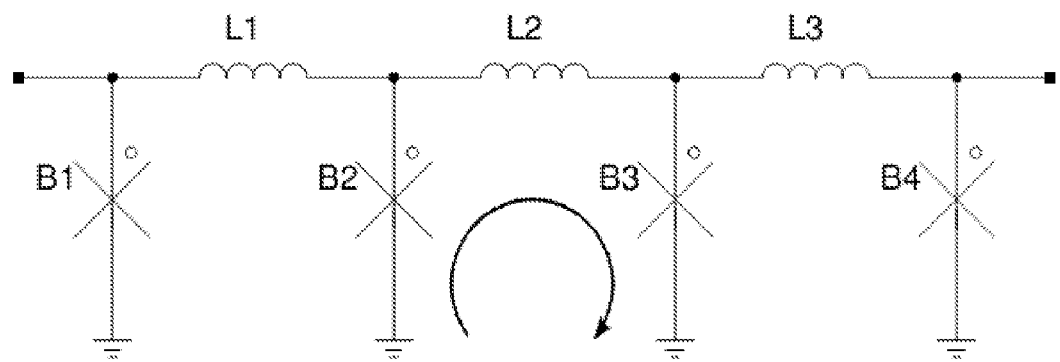
FIG. 3 is a representation of an electrical circuit used to explain the calculation of change in magnetic flux.
Figure 4:
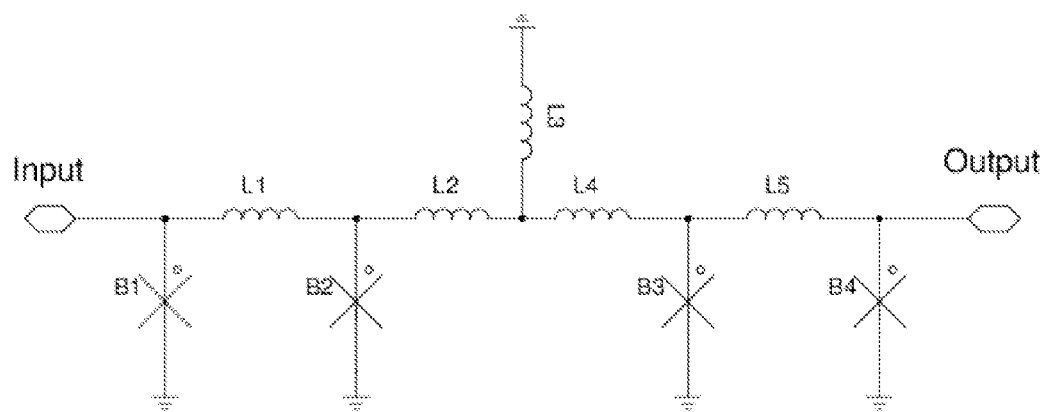
FIG. 4 is an example of an electrical circuit which is an exception to the general rule described in FIG. 3.

After the initial input sequence has been created (47) a specific spice deck is set up (49) with the input sequence, ensuring the pulses are applied to the inputs as necessary with the output being the information from the components in the save list. This spice deck is then run (50) using JSIM. The output of the spice deck will then be processed. This is done by calculating the amount of flux present inside every inductive loop identified and subtracting the amount of flux present in the initial state. These net flux values are then checked for a gain or a loss of a fluxon. The method for calculating the amount of flux was explained previously, with regards to FIG. 3. The amount of times the output junctions switch will also be calculated. This is done by calculating the finite difference vector of the output result vector (the junction phase) of each junction. It was empirically found that if the value of the finite difference vector exceeds 1.5 one may safely assume that the junction made a switch to its resistive state and back to its superconductive state. The value of the finite difference should then fall below 1 before another switch can be identified. At this stage the time is also determined between the arrival of the input pulse and the generation of the output pulse at the user supplied output junction. This time is determined by measuring the delay between the first Junction to switch that is connected directly to the input node and the switching of the output junction as specified by the user. The finite difference value of 1.5 is used as the precise moment that the switching process occurs. The values of the flux in each loop are saved for the initial state. Note that by definition any stored fluxons in the initial state will not be found at the start of the algorithm since all subsequent loop flux values will be compared to that of the initial state. If the initial state did indeed store a fluxon a later state will be merely be found to have gained a negative fluxon.

After updating the flux and switching information of the initial state the algorithm continues by choosing a state which is yet to be investigated (52). At the algorithm start-up this state will be the initial state (48). The input sequence vector will then be populated (49) by the pulse sequence that caused the circuit to be in the state under investigation. A single pulse will now be added on every untested input in turn to discover the state transitions (53). In effect a pulse will be added one at a time on each input after which the circuit will be inspected for the presence or absence of fluxons. Before a pulse is added the list of user rules are inspected to ascertain the legality of the added pulse. Note that the delay between the pulses remains the same to ensure that the circuit will be tested in a stable state.

After each pulse is added, the spice deck will be executed (54) and the data processed in the same fashion as was explained for the initial state. This processed data is then checked against all the known states to ascertain if an already existing state has been found (55), for example that the input pulse caused the circuit to reach a state we already know of. If this is not the case a new state is created (56) with values of that found from the processed data. The new state will then be added to the un-investigated state list. The information on the state currently under investigation will be updated (57) to show to which state the circuit will transition if a pulse arrives on the input tested, and the input marked as tested (58). After all the inputs are tested (59) the state is updated as investigated or tested (60) and if all states have not been tested (61) the next un-investigated state is selected (52). The algorithm ends (62) when there are no more un-investigated states. The save list will also now be updated to contain only components of the inductive loops that are storing a fluxon in any of the states.

Figure 8:
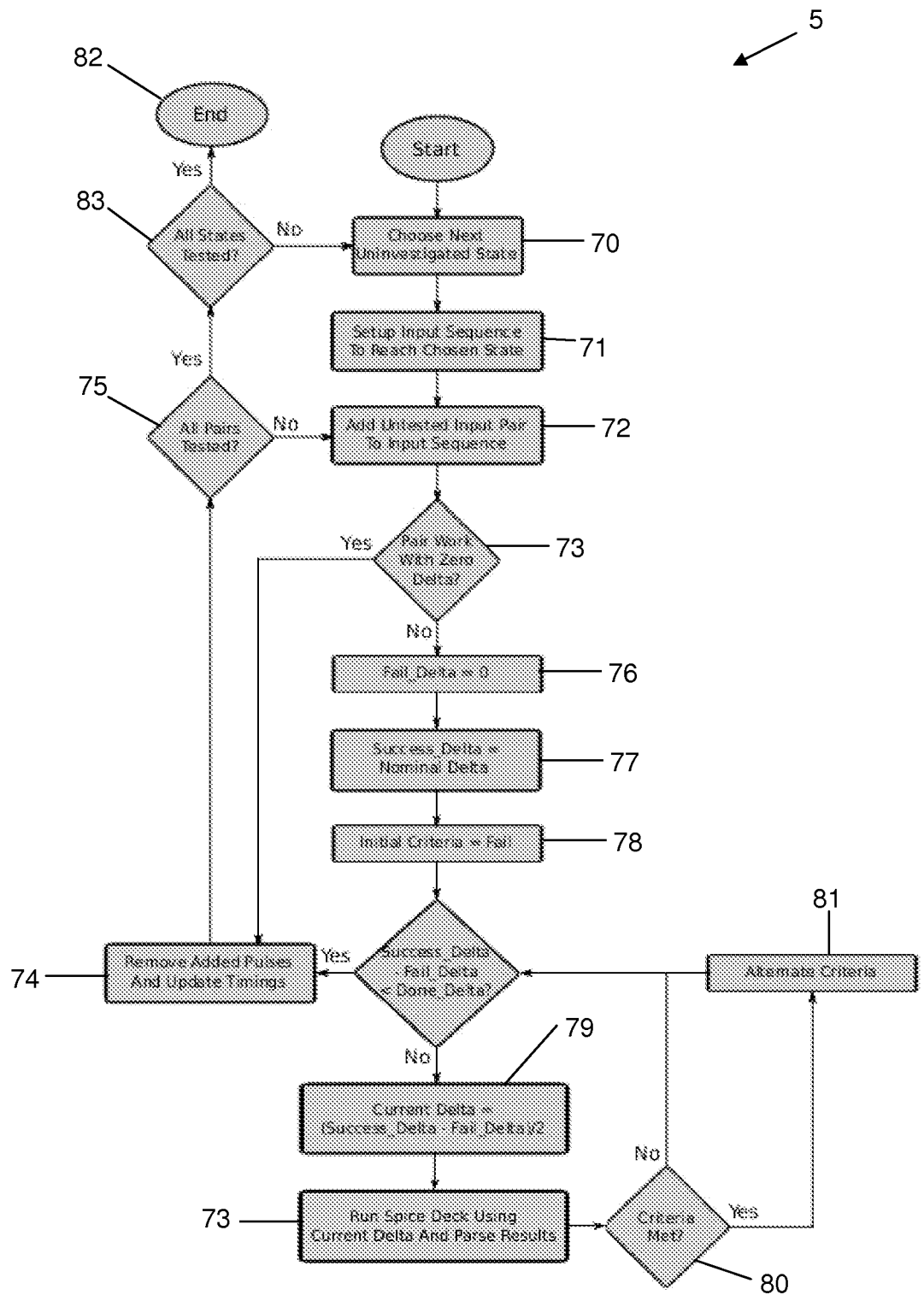
FIG. 8 is a flow diagram illustrating the method implemented to extract the timing characteristics.

Extracting state timings (20) is the next step in the method. Once the state machine representation has been extracted the timing information for each state can be found. This is done by measuring the smallest possible delay between two consecutive pulses. All possible combinations of pulse-pairs should be investigated for each state. Given that a circuit has two inputs, Input A and Input B, the timing characteristics would be calculated for the pairs Input A and Input A, Input A and Input B, Input B and Input A and Input B and Input B. The timing information would consist of the minimum amount of time allowable between the two pulses so that the circuit is still functional. Note that this timing information should be obtained for each state since the minimum allowable time might change when fluxons are stored in the circuit. The algorithm will be explained in conjunction with FIG. 8. FIG. 8 shows a flow diagram (5) of the steps implemented as part of the method step followed to extract the timing characterisation.

Initially an uninvestigated state is selected for investigation (70). As with the state machine extraction process, an input sequence structure is used as stimulus for the spice deck. This input sequence is initially populated (71) with the sequence of pulses necessary to reach the state under investigation. A pair of untested inputs are selected and tested for legality against the user supplied rules. If a legal pair is found, the pulses are added to the input sequence structure (72). The algorithm next tests if there is a timing related relationship between the inputs by using the shortest possible delay between the pulses. If the input pair was selected as Input A and Input B, for example, a pulse would be applied to Input B one time unit (usually 1 picosecond) after Input A. Note that the length of an SFQ pulse is finite and thus an input pair consisting of the same inputs would not create the correct stimulus if pulsed too close to each other. Since the length of the SFQ pulse depends on various factors it is advisable to use a time difference large enough to ensure correct testing operation. Empirically it was found that 20 picoseconds was a good rule of thumb, though other time delays might also work. Thus, if the input pair was Input A and Input B the shortest possible delay to test would be 20 picoseconds. Once the pulses have been applied the spice deck should be executed (73) and the results tested for functionality. Functionality testing is done in two steps. The first step is to ascertain if the correct state was reached. The state that should be reached if the circuit is functional can be found by following the state transitions of the nominal state machine representation as extracted in the previous step. This thus compares the state reached when the circuit was assured to be stable to the state reached when the time delay between the last two pulses are varied. State comparison is done by comparing the fluxon storage loops of the two states for the presence or absence of a fluxon.

Note that during the state comparison only the fluxon storage loops were investigated for functionality. In order to ensure that no fluxons might be trapped in loops not investigated due to unforeseen effects caused by the time delays, another test is needed. For this test the state machine representation is again extracted, only this time the last input sequence used for timing extraction will serve as starting sequence for extraction process. For example, assume that a delay of 50 picoseconds between Input A and Input B is currently being investigated. The input sequence of the state machine extraction process would always contain these two pulses along with any other pulses appended to the sequence as needed by the algorithm. There is thus a possibility that the initial state of the nominal state machine representation and this new state machine representation would not be the same. The state machine extracted from this starting sequence will then be compared state by state to the nominal functional representation.

If the input pair under timing investigation resulted in correct circuit operation (73) with the minimal time delay it can be surmised that this pair is unaffected by the delay. Note that if, for example, pair Input A and Input B is unaffected by the minimum delay it does not necessarily mean that the pair Input B and Input A is also unaffected by this delay. Both cases thus need to be investigated. The pulses can then be removed and the timings updated for the chosen pair (74). If all pairs have not been tested (75) the next untested pair can then be selected for investigation (72).

However, if this is not the case, a binary search routine is used to pin-point the minimum time delay. If the pair is affected by the minimum delay a binary search routine is run to ascertain exactly where (in terms of delay) the circuit stop functioning. This value will then be used to check for timing violations in the HDL model. The specific implementation of the binary search constitutes alternating the functional criteria whilst reducing the point of test by half until said criteria is achieved. In order to do this an initial time delay that results in a failure (76) as well as an initial time delay that results in a success (77) is needed. If we are at this stage of the algorithm it is known that the circuit failed with the minimum delay thus this delay will serve as our initial failure delay. Furthermore it is also known that the circuit succeeded with the nominal delay used for the initial state machine extraction. This value can thus serve as the initial success delay. The initial criteria can be chosen to be success or failure (78). Given the failure and success delay the next time delay to investigate would be situated between these times (79).

The circuit is then once again tested using the same method of functionality testing (correct state and correct state machine representation). If the criteria have not been met (80) the success or fail delta is updated with the new delay information. For example, if the criteria were failure and the circuit was operational at the new testing delay, the Success Delta would be updated with this current delay value. A new delay value to test will then be generated using the same formula as before after which the functionality is once more investigated. This process continues until the criteria is met (for example the circuit is functional if the current criteria is success). After the criteria is met the opposite criteria will be used for the next investigation (81). Throughout this process the difference between the Success Delta and the Fail Delta will be tested against a wanted sensitivity value. This value indicates how fine our estimation of the precise delay that causes the circuit to fail should be. Generally a value of 2 picoseconds is used for this delay as it was empirically shown to produce good results. All legal input pairs are tested according to this procedure. Once done, the next untested state is selected for investigation (72). The algorithm ends (82) when all the states have been investigated (83).

The final step (22) in the method of the invention involves generating a VHDL model. Once the state machine representation has been extracted and the timing characteristics mapped, the HDL model can be constructed. A normal state machine implementation is used in VHDL in conjunction with logic specifically designed to capture timing violations. Since VHDL was designed to function with voltage state logic circuits, the presence of a SFQ pulse will be modelled by a picosecond long pulse. The rising edge of this pulse will be used as trigger for state transitions. An explanation for the HDL model generation follows by means of an example.

Figure 1:
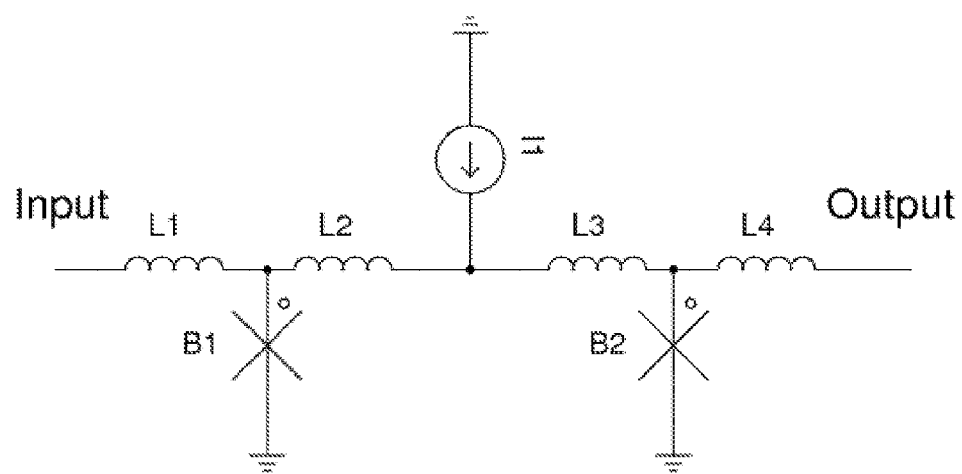
FIG. 1 is an example of a Josephson Transmission Line (JTL)
Figure 2:
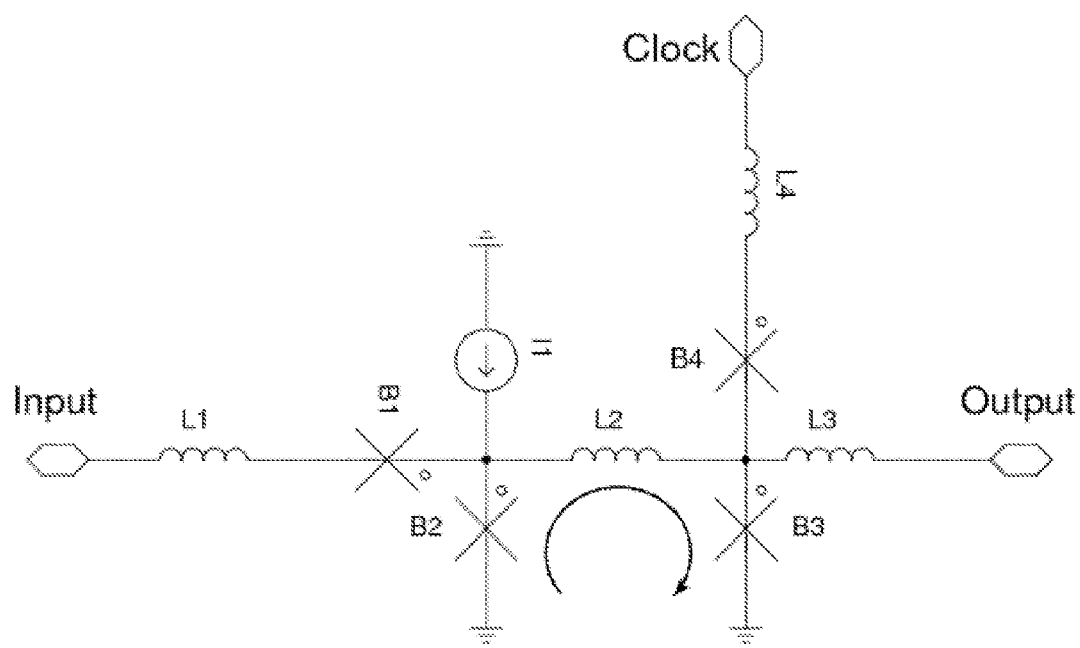
FIG. 2 is an example of an RSFQ D-Flip-Flop circuit.

Consider the D-Flip-Flop circuit in FIG. 2. Assume that the state diagram was extracted as shown in FIG. 9 and the following timing characteristics were found.

If in State 0, a Data-In pulse followed by a Clock pulse must be separated by at least 10 picoseconds.

If in State 1, a Clock pulse followed by a Data-In pulse must be separated by at least 10 picoseconds.

If in State 1, an arrival of the Clock pulse generates a Data-Out pulse 5 picoseconds later.

The VHDL code (7) as shown in FIG. 10 will then be generated.

The ENTITY block of the code specifies the inputs and outputs of the circuit. Two inputs (91), data-in and clock, are specified as well as the output (92) data-out. The architecture describes the behaviour of this digital logic circuit. Signals for the current-state (93) and possible timing violations are declared and initialized. An output signal (94) is also declared and initialized. This signal is used to force the output of the gate to a known value. Signals are used inside the architecture definition.

In VHDL a PROCESS block (95) designates sequential actions to be performed. All signal updates only occur once the process block is completed. This PROCESS block (95) is divided into two main sections. The first section gives instructions that should be executed if a rising edge is detected on the data in input (data-in 'EVENT' and data-in='1' (96)) whilst the second section provides instructions for when a rising edge is detected on the clock input (clock 'EVENT' and clock='1' (97)).

These sections are now further divided into instructions that should be executed depending on which state the logic gate is in. Before the state-specific instructions are executed a test is made in order to ascertain if a timing violation occurred. This check is implemented via an input-specific signal that is asserted whenever the arrival of said input would cause a timing violation. An example of this signal assertion can be seen in the code to be executed on the arrival of a data-impulse when the circuit is in state 0. The timing characteristics extracted using the algorithm of the previous section identified that if a data-impulse arrived when the circuit is in state 0, a clock pulse should not arrive within 10 picoseconds. As can be seen from the code, the "clock-err" signal is asserted for 10 picoseconds. Any arrival of a clock input in this time can then be flagged as a circuit failure.

Note that the last signal assignment will always be executed. An example will be used to explain the implications of this statement. Suppose that we have a circuit with two data inputs, Data A and Data B, and a Clock input. The timing characteristics of this circuit were as follows:

If in State 0, a Data A pulse followed by a Clock pulse must be separated by at least 10 picoseconds.

If in State 0, a Data B pulse followed by a Clock pulse must be separated by at least 15 picoseconds.

Suppose now that a pulse arrives on Data A, after which a pulse arrives on Data B, 5 picoseconds later. Note that under these circumstances the "clock-err" signal will be asserted for 20 picoseconds. The arrival of Data A will assert the "clock-err" signal for 10 picoseconds but Data B's arrival will overwrite this assertion 5 picoseconds later. Data B's assertion will then be completed in full giving a total of 20 picoseconds. An HDL model of the Spice Deck is thus created using the extract state machine representation as well as the timing characteristics.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention.

The invention claimed is:

1. An automated method of extracting a state machine representation of a digital logic superconductive circuit from an alphanumeric representation of the circuit, the alphanumeric representation specifying circuit components, including at least inductive elements, their interconnectivity and input and output nodes, the method comprising:
receiving, from an input, the alphanumeric representation of the circuit;
simulating the circuit with an input signal unit, as directed by a processor, in a suitable software environment utilising the alphanumeric representation received from the input;
receiving a circuit output from an output signal unit in communication with the processor and identifying, with the processor, inductive loops in the circuit;
identifying one or more of the inductive loops in the circuit capable of storing one or more magnetic fluxons, with the processor, and discarding all others;
extracting the state machine representation with the processor, using only the inductive loops in the circuit capable of storing magnetic fluxons; and
constructing a Hardware Description Language (HDL) model for the digital logic superconductive circuit with the processor.

2. A method as claimed in claim 1, wherein the step of extracting the state machine representation includes the steps of defining an initial state for the circuit and analysing the circuit in the initial state; iteratively applying a combination of input signals to the input nodes of the circuit and analysing the circuit for each input signal so applied with reference to the initial state to determine if the circuit enters a new state when the input signals are applied; and iteratively applying input signals to each of the input nodes of the circuit with the circuit in each newly identified state, each time analysing the circuit to identify additional new states, until all possible states of the circuit have been identified.

3. A method as claimed in claim 2, which includes the step of specifying a set of input rules comprising unallowable combinations of input signals and avoiding the unallowable combinations during the step of extracting the state machine.

4. A method as claimed in claim 1, which includes the step of parsing and flattening the alphanumeric representation of the circuit.

5. A method as claimed in claim 1, which includes the step of storing the inductive loops capable of storing magnetic fluxons in a vector of components for further processing.

6. A method as claimed in claim 2, which includes the step of measuring and storing timing delays between the application of input signals to input nodes and resulting changes on output nodes of the circuit.

7. An automated method of constructing a Hardware Description Language ("HDL") model for a digital logic superconductive circuit from an alphanumeric representation of the circuit, the alphanumeric representation specifying circuit components, including at least inductive elements, their interconnectivity and input and output nodes, the method comprising:
receiving, from an input, the alphanumeric representation of the circuit;
simulating the circuit with an input signal unit, as directed by a processor, in a suitable software environment utilizing the alphanumeric representation received from the input;
receiving a circuit output from an output signal unit in communication with the processor and identifying, with the processor, inductive loops in the circuit;
identifying one or more of the inductive loops in the circuit capable of storing one or more magnetic fluxons, with the processor, and discarding all others;
extracting the state machine representation with the processor, using only the inductive loops in the circuit capable of storing magnetic fluxons;
iteratively applying different combinations of input signals to the circuit in each of its extracted states with the input signal unit, measuring the performance of the circuit from the circuit output with the output signal unit, and extracting timing characteristics of the circuit from the circuit output with the processor; and
constructing the HDL model with the processor using the state machine representation and extracted timing characteristics of the circuit.

8. A method as claimed in claim 7, wherein iteratively applying different combinations of input signals to the circuit includes the step of measuring the smallest possible delay between two consecutive input signals with which, when applied, the circuit is still functional, the smallest possible delay being measured with the circuit in each of the identified states and for all possible input combinations of the circuit.

9. A method as claimed in claim 8 wherein iteratively applying different combinations of input signals to the circuit includes testing the functionality of the circuit for a chosen combination of input signals and delays between the signals by determining whether the circuit transitioned into the correct state on application of the input signals, as determined by the state machine representation of the circuit.

10. A method as claimed in claim 9 wherein iteratively applying different combinations of input signals to the circuit includes, if the circuit is affected by a chosen delay between input signals, utilising a binary search routine to determine the time delay between input signals at which the circuit stops functioning correctly.

11. A system for extracting a state machine representation of a digital logic superconductive circuit from an alphanumeric representation of the circuit, the alphanumeric representation specifying circuit components, including at least inductive elements, their interconnectivity and input and output nodes, the system comprising:
an input configured to receive the alphanumeric representation of the circuit;
a processor; and
an electronic storage module on which is stored instructions configured to cause the processor to simulate the circuit in a suitable software environment utilising the alphanumeric representation, identify inductive loops in the circuit; identify inductive loops in the circuit capable of storing one or more magnetic fluxons and discard all others, and extract the state machine representation using only the inductive loops in the circuit capable of storing magnetic fluxons.

12. A system as claimed in claim 11, in which the machine instructions cause the processor to define an initial state for the circuit and analysing the circuit in the initial state; to iteratively apply a combination of input signals to the input nodes of the circuit and analyse the circuit for each input signal so applied with reference to the initial state to determine if the circuit enters a new state when the input signals are applied; and to iteratively apply input signals to each of the input nodes of the circuit with the circuit in each newly identified state, each time analysing the circuit to identify additional new states, until all possible states of the circuit have been identified.

\* \* \* \* \*